(12) United States Patent
Pfeuffer et al.

(10) Patent No.: US 9,041,396 B2
(45) Date of Patent: May 26, 2015

(54) DYNAMIC $B_0$ FIELD DETECTION BY MAGNETIC RESONANCE NAVIGATORS, AND CORRECTION FOR MULTICHANNEL RECEPTION AND/OR TRANSMISSION RF COIL CONFIGURATIONS

(75) Inventors: Josef Pfeuffer, Kunreuth (DE); Lawrence Wald, Cambridge, MA (US)

(73) Assignees: Siemens Aktiengesellschaft, Munich (DE); Massachusetts General Hospital Corporation, Boston, MA (US)

( * ) Notice: Subject to any disclaimer, the term of this patent is extended or adjusted under 35 U.S.C. 154(b) by 644 days.

(21) Appl. No.: 13/355,937

(22) Filed: Jan. 23, 2012

(65) Prior Publication Data

US 2013/0187650 A1    Jul. 25, 2013

(51) Int. Cl.
| | |
|---|---|
| *G01V 3/00* | (2006.01) |
| *G01R 33/24* | (2006.01) |
| *G01R 33/46* | (2006.01) |
| *G01R 33/565* | (2006.01) |
| *G01R 33/483* | (2006.01) |
| *G01R 33/561* | (2006.01) |

(52) U.S. Cl.
CPC .......... *G01R 33/243* (2013.01); *G01R 33/4616* (2013.01); *G01R 33/4835* (2013.01); *G01R 33/5616* (2013.01); *G01R 33/56563* (2013.01)

(58) Field of Classification Search
CPC .................................................. G01R 33/4616
USPC .......................... 324/309, 307, 306, 312, 300
See application file for complete search history.

(56) References Cited

U.S. PATENT DOCUMENTS

| | | | |
|---|---|---|---|
| 6,586,935 B1 | 7/2003 | Ma et al. | |
| 7,064,547 B1 * | 6/2006 | King et al. | .................... 324/309 |
| 7,292,034 B2 * | 11/2007 | Hennig et al. | ................ 324/309 |
| 7,358,732 B2 * | 4/2008 | Van Der Kouwe et al. | ... 324/309 |

OTHER PUBLICATIONS

"Retrospective Estimation and Correction of Physiological Artifacts in fMRI by Direct Extraction of Physiological Activity from MR Data," Le et al., Magnetic Resonance in Medicine, vol. 35, No. 3 (1996) pp. 290-298.
"Image-Based Method for Retrospective Correction of Physiological Motion Artifacts in fMRI: RETROICOR," Glover et al., Magnetic Resonance in Medicine, vol. 44, No. 1 (2000) pp. 162-167.
"Functional MR Imaging in the Awake Monkey: Effects of Motion on Dynamic Off-Resonance and Processing Strategies," Pfeuffer et al., Magnetic Resonance in Medicine, vol. 25, No. 6 (2007) pp. 869-882.

(Continued)

*Primary Examiner* — Louis Arana
(74) *Attorney, Agent, or Firm* — Schiff Hardin LLP

(57) ABSTRACT

In a method for calculating a $B_0$ field map (a map of the basic magnetic field) in a magnetic resonance apparatus, a navigator pulse is emitted and navigator response resulting from the navigator pulse are detected in at least some channels of a multichannel RF coil array. Each channel of the multichannel RF coil array includes an RF coil and spatial information regarding the respective positions of the individual RF coils is made available to a processor, together with the multiple navigator signals. Using the spatial information obtained from the position of the RF coils that respectively detected the navigator response signals, a $B_0$ field map is generated, without the need for spatial encoding the respective navigator response signals.

11 Claims, 3 Drawing Sheets

(56) References Cited

OTHER PUBLICATIONS

"Correction of Physiologically Induced Global Off-Resonance Effects in Dynamic Echo-Planar and Spiral Functional Imaging," Pfeuffer et al., Magnetic Resonance in Medicine, vol. 47 (2002) pp. 344-353.

"Real-Time Autoshimming for Echo Planar Timecourse Imaging," Ward et al. Magnetic Resonance in Medicine, vol. 48 (2002) pp. 771-780.

Point Spread Function Mapping with Parallel Imaging Techniques and High Acceleration Factors: Fast, Robust, and Flexible Method for Echo-Planar Imaging Distortion Correction, Zaitsev et al., Magnetic Resonance in Medicine, vol. 52 (2004) pp. 1156-1166.

Correction for Geometric Distortion and N/2 Ghosting in EPI by Phase Labeling for Additional Coordinate Encoding (PLACE), Xiang et al. Magnetic Resonance in Medicine, vol. 57 (2007) pp. 731-741.

* cited by examiner

DYNAMIC $B_0$ FIELD DETECTION BY MAGNETIC RESONANCE NAVIGATORS, AND CORRECTION FOR MULTICHANNEL RECEPTION AND/OR TRANSMISSION RF COIL CONFIGURATIONS

BACKGROUND OF THE INVENTION

1. Field of the Invention

The present invention concerns methods and devices for correcting four field inhomogeneities in the basic magnetic field ($B_0$) field in magnetic resonance imaging systems, particularly in such imaging systems using a multichannel reception and/or transmission RF (radio-frequency) coil configuration.

2. Description of the Prior Art

Functional magnetic resonance imaging (fMRI) is implemented by repeatedly acquiring image volumes, particularly of the brain, with fast imaging sequences such as echo-planar imaging (EPI) or spiral imaging. A sequence known as BOLD (Blood Oxygen Level Detection) generates a so-called BOLD signal that changes dependent on the oxygen level in blood in the detected region, this oxygen level, in turn being indicative of brain activity in the region. The detection of changes in the BOLD signal, which includes changes in Two*, CBF and CBV, relies on a statistical analysis of the time series implemented for each voxel in the examination region. For example, correlation analysis or General Linear Model (GLM) analysis of the time series with the paradigm that is employed (e.g., active and baseline conditions) convoluted with a hemodynamic response function is a basic procedure for fMRI. The underlying assumption is the stability of the measured signal in the spatial domain as well as in the temporal domain. Such preconditions are valid as well for other fast imaging applications, such as diffusion imaging and perfusion imaging.

Spatial stability can be disturbed by gross subject motion, and many techniques are known for correcting for spatial instability.

Temporal stability is maintained by fitting theoretical model functions of drifts (e.g., sine expansion terms) to the voxel-based time courses. Global frequency changes in the magnetic resonance system (Dynamic Off-Resonance changes in K-space, DORK) also can be monitored and corrected. Physiological signals such as respiration and heart-beat can be recorded by extracorporeal devices, and used as regressors in the fMRI analysis, such as in the GLM statistics.

Static and dynamic image deterioration in EPI images and spiral images has its source in a non-uniform $B_0$ field, typically caused by the object itself brought into the $B_0$ field (static $B_0$ field distortion) or by external dynamic changes (dynamic $B_0$ field change) caused by physiological changes, movement of the object, or system instabilities.

Mapping of the $B_0$ field is a known technique resulting in $B_0$ field maps, which are translated into image distortion maps or voxel displacement maps that are used for image correction in the image processing procedures that are employed.

The measurement of a high-quality $B_0$ field map, however, requires at least multiple scan repetitions (TRs) lasting between 6 and 10 seconds a piece, and often resulting in a mapping procedure lasting between 1 and 2 minutes. These additional sources for dynamic noise and image deterioration hamper the detection of reliable MR images (fMRI, DWI, perfusion) and therefore it is essential to monitor such sources and to take their effect into consideration in the image correction, for example in the statistical analysis of and fMRI series. These noise sources exist in real time, and can be directly used for image correction during the progress of the data acquisition (in-line). Most often, however, more complicated statistical analysis is implemented after the measurement (data acquisition) has been completed (off-line post-processing).

Examples of known procedures for correction of temporal change due to physiological noise are described in "Retrospective Estimation and Correction of Physiological Artifacts in fMRI by Direct Extraction of Physiological Activity from MR Data," Le et al., Magnetic Resonance in Medicine, Vol. 35, No. 3 (1996) pgs 290-298; "image-Based Method for Retrospective Correction of Physiological Motion Artifacts in fMRI: RETROICOR," Glover et al., Magnetic Resonance in Medicine, Vol. 44, No. 1 (2000) pgs 162-167; "Functional MR Imaging in the Awake Monkey: Effects of Motion on Dynamic Off-Resonance and Processing Strategies," Pfeuffer et al., Magnetic Resonance in Medicine, Vol. 25, No. 6 (2007) pgs 869-882 and "Correction of Physiologically Induced Global Off-Resonance Effects in Dynamic Echo-Planar and Spiral Functional Imaging," Pfeuffer et al., Magnetic Resonance in Medicine, Vol. 47 (2002) pgs 344-353. EPI distortion correction (static and dynamic) is described in "Real-Time Autoshimming for Echo Planar Timecourse Imaging," Ward et al. Magnetic Resonance in Medicine, Vol. 48 (2002) pgs 771-780; "Point Spread Function Mapping with Parallel Imaging Techniques and High Acceleration Factors: Fast, Robust, and Flexible Method for Echo-Planar Imaging Distortion Correction, Zaitsev et al., Magnetic Resonance in Medicine, Vol. 52 (2004) pgs 1156-1166 and Correction for Geometric Distortion and N/2 Ghosting in EPI by Phase Labeling for Additional Coordinate Encoding (PLACE)," Xiang et al. Magnetic Resonance in Medicine, Vol. 57 (2007) pgs 731-741.

SUMMARY OF THE INVENTION

It is an object of the present invention to improve $B_0$ mapping for use in image correction and/or recalculation of imaging parameters from scan repetition-to-scan repetition in magnetic resonance data acquisition procedures using a multichannel RF coil configuration for transmission (emitting) RF excitation signals and/or receiving the resulting RF signals following excitation.

This object is achieved in accordance with the present invention by using navigators received from each of the respective channels (or at least multiple channels among the totality of respective channels) for generating the $B_0$ map. An additional spatial selection (localization) of the signal from each individual RF coil is thereby achieved. This is then combined with navigator signal artifact detection. In accordance with the present invention, spatial encoding in the navigator itself is not needed in order to be able to obtain a spatial map. Instead, the necessary spatial information is obtained from the respective multiple coils in the multichannel coil configuration.

DESCRIPTION OF THE PREFERRED EMBODIMENTS

Figure 1:
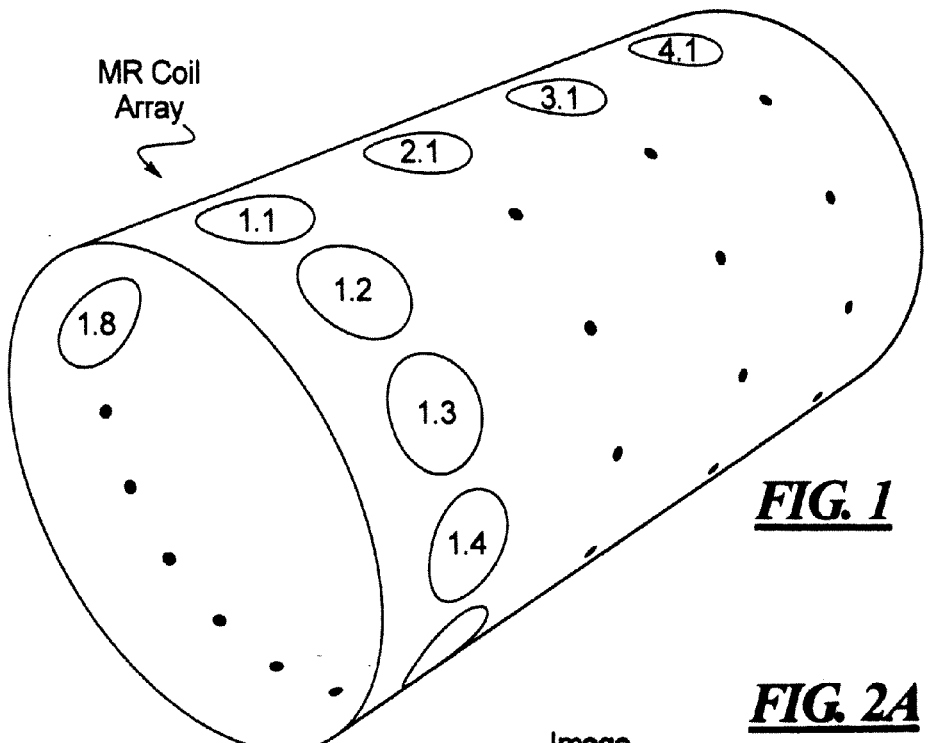
FIG. 1 schematically illustrates an embodiment of a multichannel magnetic resonance (MR) coil array of the type suitable for use in accordance with the present invention.

FIG. 1 schematically illustrates an example of a multichannel RF coil configuration of the type used as a transmission or reception coil for magnetic resonance data acquisition. The multichannel coil array in this embodiment has 32 channels, respectively formed by individual coils of the array arranged in successive annular rings around the generally cylindrical overall configuration. Individual coils 1.1, 1.2, 1.3, 1.4 ... 1.8 are shown that form one annular ring, and successive annular rings are also present, designated respectively by individual coils 2.1, 3.1 and 4.1.

Figure 2A:
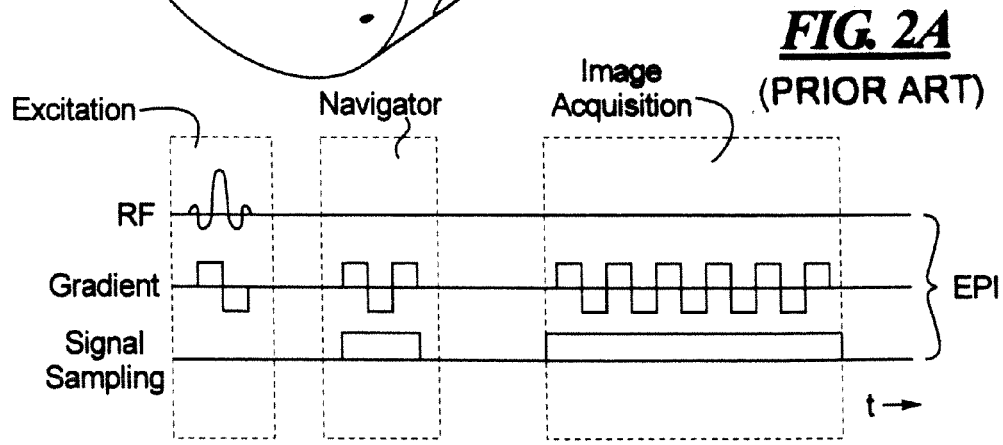
FIG. 2A schematically illustrates the use of a navigator in the context of an echo planar imaging (EPI) sequence.

FIG. 2A schematically illustrates the known use of a navigator in combination with an echo-planar imaging (EPI) sequence, wherein the navigator and an associated gradient are emitted (activated) following RF excitation, possibly with a slice selective gradient. Image acquisition takes place by signal sampling with a gradient of alternating polarity.

In the conventional use of $B_0$ mapping by means of a navigator in EPI, it is necessary to obtain spatial information from the navigator itself, thereby making the signal acquisition and/or the computational procedures more complicated and possibly more time consuming.

Figure 2B:
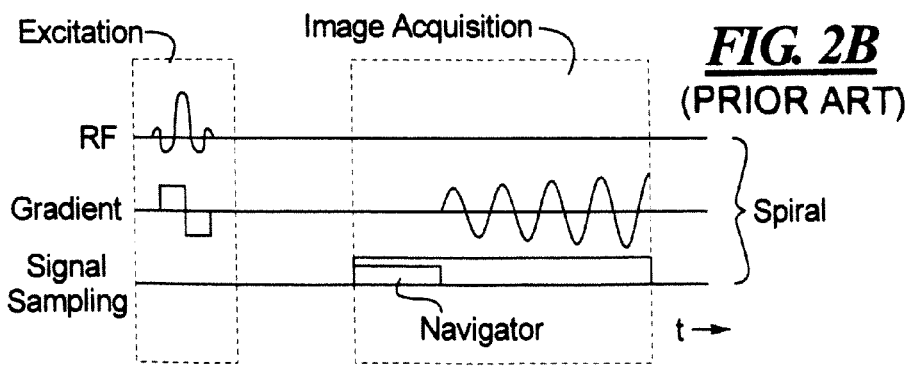
FIG. 2B schematically illustrates the use of a navigator in a spiral imaging sequence.

Another known technique making use of a navigator for $B_0$ mapping is spiral imaging, as schematically illustrated in FIG. 2B. In the case of spiral imaging, the navigator is embedded (a part of) the signal sampling, rather than a separately, earlier-emitted signal.

In accordance with the invention, echoes from the navigator are acquired individually with at least some, and preferably all, of the individual coils of the multichannel coil array. As in the case of parallel imaging, for example, the sensitivity profile of each of these individual coils is known in advance, such as by a determination made in a calibration procedure. In accordance with the invention, the navigator echoes that are individually received by the respective individual coils of the coil array provides the necessary spatial information for using the navigator echoes to formulate a $B_0$ map.

Figure 3A:
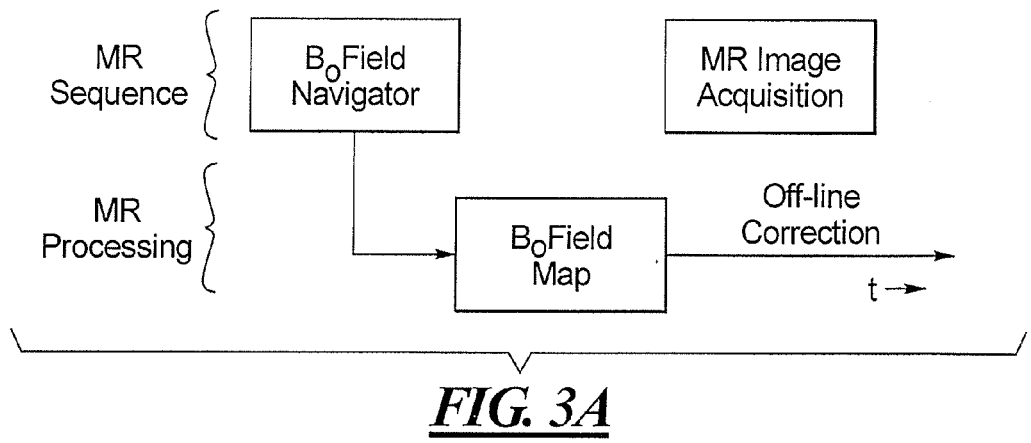
FIG. 3A schematically illustrates the generation of a $B_0$ field map in accordance with the invention for off-line image correction.

As schematically indicated in FIG. 3A, the $B_0$ field map obtained in this manner in accordance with the invention can be used in an off-line correction of the image data, implemented during image reconstruction (post-processing) that follows the completion of the MR image acquisition procedure.

Figure 3B:
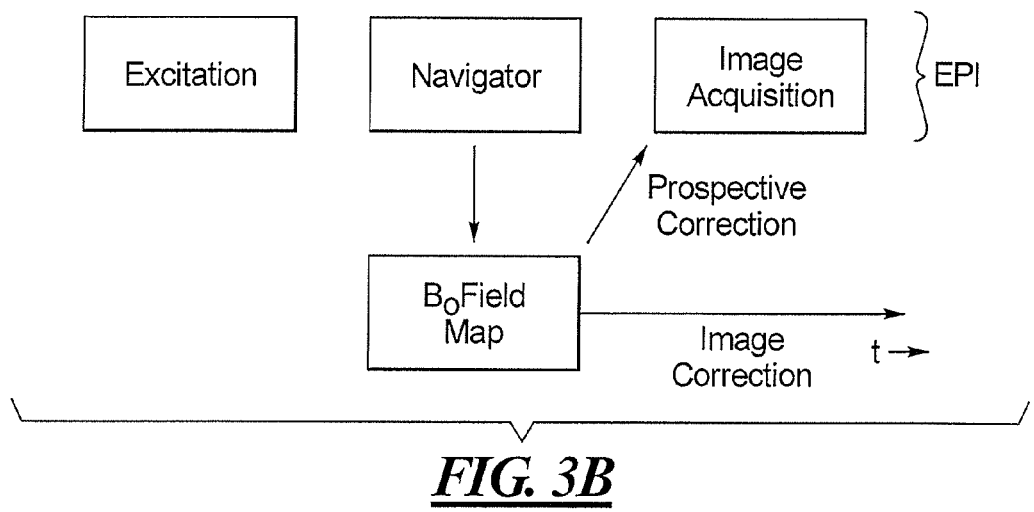
FIG. 3B schematically illustrates the use of $B_0$ field map in accordance with the invention for a perspective image acquisition correction.

As schematically illustrated in FIG. 3B, the $B_0$ field map in accordance with the invention can alternatively or additionally be used to make an immediate prospective correction in the image acquisition that follows the navigator echo and the formulation of the $B_0$ field map.

Figure 4:
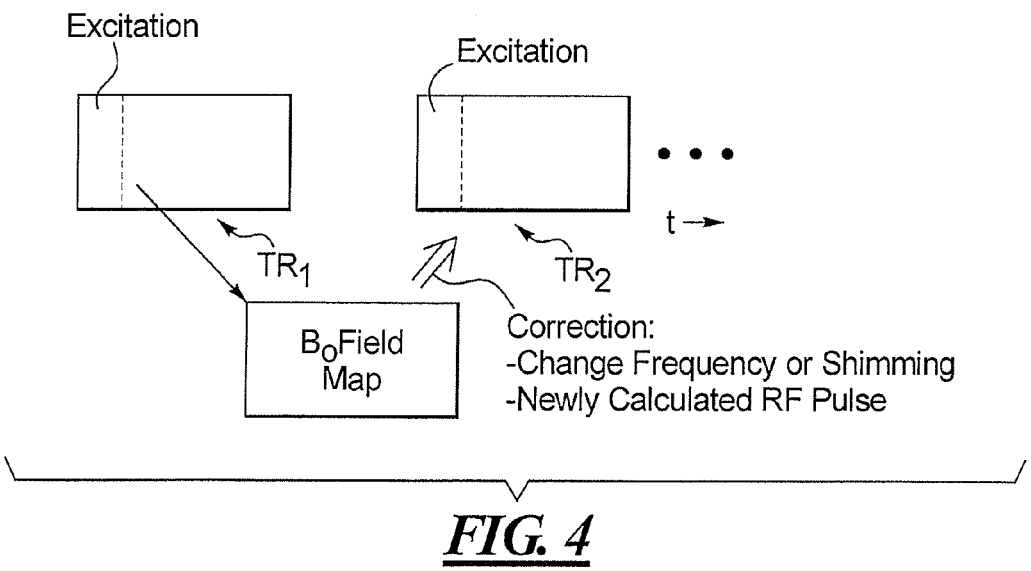
FIG. 4 schematically illustrates corrections that can be made in accordance with the invention using a $B_0$ field map from repetition-to-repetition in a multi-repetition data acquisition procedure.

Moreover, as shown in FIG. 4, such a correction using the $B_0$ field map produced in accordance with the invention from the multichannel coil configuration can be used to make corrections in successive repetitions in a multi-repetition data acquisition procedure. As shown in FIG. 4, MR data and navigator echoes acquired in a first repetition $TR_1$, implemented in a multichannel MR system, to generate a $B_0$ field map, and the $B_0$ field map can then be used to implement a correction in the next repetition $TR_2$. This procedure can be repeated for each subsequent repetition, as desired. The correction can be a change in the frequency or the shimming, or the RF pulse in the next excitation can be newly calculated based on the $B_0$ field map.

Figure 5:
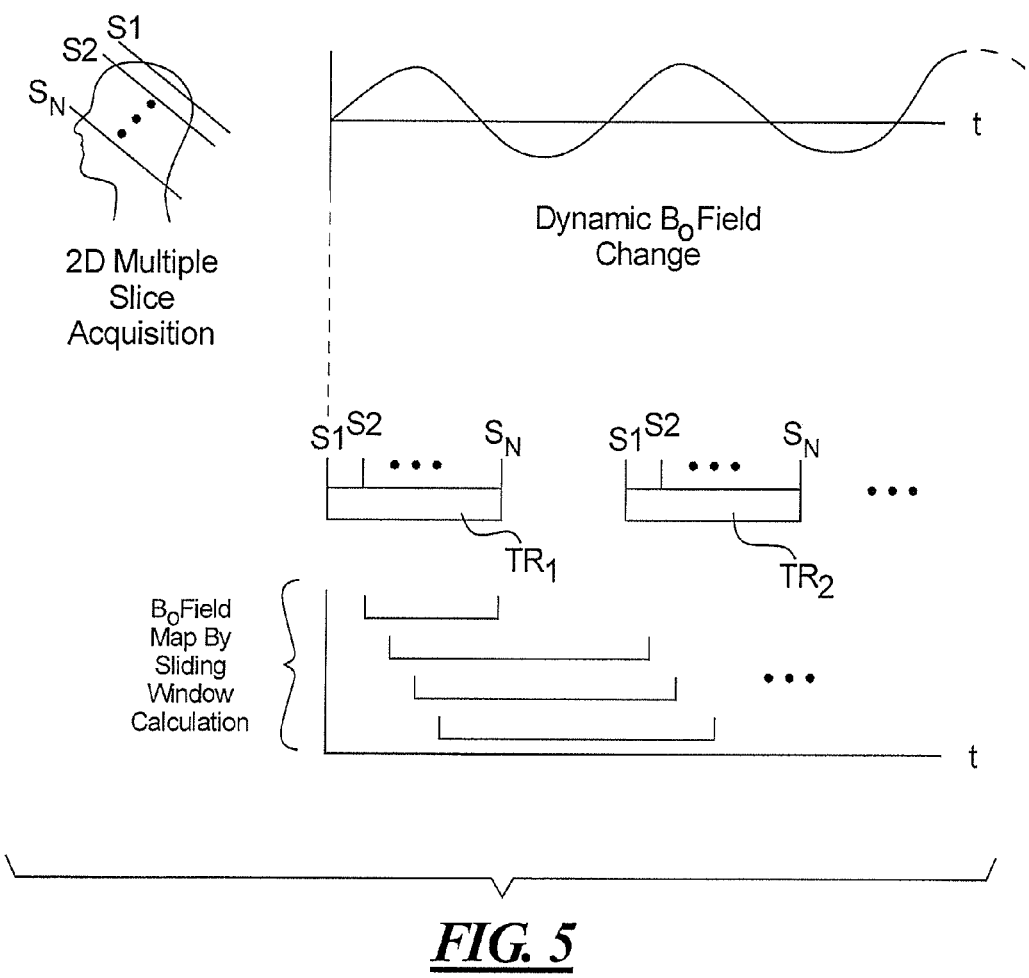
FIG. 5 schematically illustrates the generation of a $B_0$ field map in accordance with the invention to correct four dynamic $B_0$ field changes.

Another example is schematically illustrated in FIG. 5, for the purpose of making corrections in a $B_0$ field that exhibits dynamic changes, as schematically illustrated in the upper portion of FIG. 5. When multiple slices S1, S2 ... $S_n$ are acquired from an examination subject, each in multiple repetitions $TR_1$, $TR_2$ ..., a sliding window calculation of the $B_0$ field map can be implemented. The first calculation, for example, can be based only on the slices acquired in the first repetition, and then the window can be moved to eliminate, from the $B_0$ field map calculation, one or more slices from the repetition $TR_1$, while including an equal number of slices from the next repetition $TR_2$, and so on.

Although modifications and changes may be made by those skilled in the art, it is the intention of the inventor to embody within the patent warranted hereon all changes and modifications as reasonably and properly come within the scope of his contribution to the art.

I claim as my invention:

1. A method for generating a $B_0$ field map, comprising:
   activating a navigator pulse in a magnetic resonance data acquisition unit in which a basic magnetic field ($B_0$ field) exists, said magnetic resonance data acquisition unit comprising a multichannel radio-frequency (RF) reception coil array, each channel in said multichannel RF coil array comprising an RF coil;
   detecting a navigator response signal in each of a plurality of channels in said multichannel RF array, thereby producing a plurality of navigator response signals;
   providing said plurality of navigator response signals to a computerized processor and also providing said computerized processor with localization information identifying respective positions of said coils in said multichannel RF array; and
   in said computerized processor, generating a $B_0$ field map by spatially organizing said plurality of navigator response signals with said localization information respectively for the coils in said plurality of channels in which said plurality of navigator response signals were respectively detected, and making said $B_0$ field map available in electronic form as a data file.

2. A method as claimed in claim 1 comprising operating said data acquisition unit to acquire magnetic resonance data from a subject located in said $B_0$ field by providing a magnetic resonance pulse sequence to said data acquisition unit, and embodying said navigator pulse in said magnetic resonance pulse sequence.

3. A method as claimed in claim 2 wherein said magnetic resonance pulse sequence comprises an excitation phase and a data sampling phase, and using said $B_0$ field map to modify said excitation phase.

4. A method as claimed in claim 3 comprising, in said excitation phase, radiating at least one RF pulse having a pulse waveform, and using said $B_0$ field map to calculate a modified RF waveform of said at least one RF pulse.

5. A method as claimed in claim 2 wherein said magnetic resonance pulse sequence comprises an excitation phase and a data sampling phase, and using said $B_0$ field map to modify said data sampling phase.

6. A method as claimed in claim 2 wherein said magnetic resonance pulse sequence is an echo planar imaging sequence comprising an excitation phase and a data sampling phase, and activating said navigator pulse in said echo planar imaging sequence between said excitation phase and said data sampling phase.

7. A method as claimed in claim 2 wherein said magnetic resonance pulse sequence is a spiral imaging sequence comprising an excitation phase and a data sampling phase, and activating said navigator pulse in said data sampling phase of said spiral imaging sequence.

8. A method as claimed in claim 2 comprising, in an image processor, generating an image from said magnetic resonance data, and using said $B_0$ field map to correct said image.

9. A method as claimed in claim 2 comprising repeating said magnetic resonance pulse sequence in a plurality of successive repetitions, and activating said navigator pulse in at least one of said repetitions and using said $B_0$ field map to modify said magnetic resonance pulse sequence in at least one subsequent repetition following said at least one of said repetitions.

10. A method as claimed in claim 9 comprising acquiring said magnetic resonance data from a plurality of slices of said subject in each of said repetitions, and calculating said $B_0$ field map using a sliding window that successively encompasses different slices respectively from two of said repetitions occurring in immediate succession.

11. A magnetic resonance apparatus comprising:
a magnetic resonance data acquisition unit comprising a basic field magnet that generates a basic magnetic field ($B_0$ field), and a multichannel radio-frequency (RF) reception coil array, each channel in said multichannel RF coil array comprising an RF coil;
a control unit configured to operate said data acquisition unit to activate a navigator pulse therein and to detect a navigator response signal in each of a plurality of channels in said multichannel RF array, thereby producing a plurality of navigator response signals;
a computerized processor provided with said plurality of navigator response signals and also provided with localization information identifying respective positions of said coils in said multichannel RF array; and
said computerized processor being configured to generate a $B_0$ field map by spatially organizing said plurality of navigator response signals with said localization information for the respective coils in said plurality of channels in which said plurality of navigator response signals were respectively detected, and making said $B_0$ field map available in electronic form as a data file.

\* \* \* \* \*